(12) United States Patent
Zhan et al.

(10) Patent No.: US 11,082,047 B2
(45) Date of Patent: Aug. 3, 2021

(54) LOW DROPOUT LINEAR VOLTAGE REGULATOR

(71) Applicant: SOUTHERN UNIVERSITY OF SCIENCE AND TECHNOLOGY, Shenzhen (CN)

(72) Inventors: Chenchang Zhan, Shenzhen (CN); Yongxiong Ji, Shenzhen (CN); Guigang Cai, Shenzhen (CN); Shuangxing Zhao, Shenzhen (CN)

(73) Assignee: SOUTHERN UNIVERSITY OF SCIENCE AND TECHNOLOGY, Shenzhen (CN)

( * ) Notice: Subject to any disclaimer, the term of this patent is extended or adjusted under 35 U.S.C. 154(b) by 378 days.

(21) Appl. No.: 16/320,129

(22) PCT Filed: Oct. 16, 2017

(86) PCT No.: PCT/CN2017/106283
§ 371 (c)(1),
(2) Date: Jan. 24, 2019

(87) PCT Pub. No.: WO2018/129967
PCT Pub. Date: Jul. 19, 2018

(65) Prior Publication Data
US 2021/0021270 A1    Jan. 21, 2021

(30) Foreign Application Priority Data

Jan. 10, 2017   (CN) .......................... 201710015426.8

(51) Int. Cl.
*G05F 1/10*    (2006.01)
*H03L 5/02*    (2006.01)
*G05F 1/56*    (2006.01)

(52) U.S. Cl.
CPC . *H03L 5/02* (2013.01); *G05F 1/56* (2013.01)

(58) Field of Classification Search
CPC ............... H03L 5/02; G05F 1/56; G05F 1/561
(Continued)

(56) References Cited

U.S. PATENT DOCUMENTS 6,373,233 B2 *  4/2002  Bakker ................... G05F 1/575
                                                    323/282
6,977,490 B1 * 12/2005  Zhang .................... G05F 1/575
                                                    323/280

(Continued)

FOREIGN PATENT DOCUMENTS

CN       101369161 A      2/2009
CN       102707754 A     10/2012
(Continued)

OTHER PUBLICATIONS

International Search Report and Written Opinion Form PCT/ISA/210 and PCT/ISA/237, International Application No. PCT/CN2017/106283, pp. 1-7, International Filing Date Oct. 16, 2017, dated Dec. 28, 2017.

*Primary Examiner* — Ryan Jager
(74) *Attorney, Agent, or Firm* — Bond Schoeneck & King, PLLC; George McGuire

(57) ABSTRACT

A low dropout linear voltage regulator is provided. In the low dropout linear voltage regulator, a power transistor has a source connected to a power source, a gate connected to an output terminal of an error amplifier, a drain connected to an output terminal of the low dropout linear voltage regulator. A dynamic Miller compensation network has a first terminal connected to the output terminal of the error amplifier, a second terminal connected to the output terminal of the low dropout linear voltage regulator. A controller has a first terminal connected to the gate of the power transistor, and a second terminal connected to a third terminal of the Miller compensation network. The controller is configured to detect a current at the output terminal of the low dropout (Continued)

linear voltage regulator and generate control signals according to the current to control connection and disconnection of each second resistance-capacitance branch in the dynamic Miller compensation network.

16 Claims, 7 Drawing Sheets

(58) Field of Classification Search
USPC .......................................................... 361/23
See application file for complete search history.

(56) References Cited

U.S. PATENT DOCUMENTS

| 7,091,710 | B2* | 8/2006 | Yang | G05F 1/575 |
| | | | | 323/282 |
| 7,863,873 | B2* | 1/2011 | Hou | G05F 1/575 |
| | | | | 323/272 |
| 9,104,221 | B2* | 8/2015 | Kim | G05F 1/575 |
| 9,122,292 | B2* | 9/2015 | Pan | G05F 1/575 |
| 9,459,642 | B2* | 10/2016 | Chen | G05F 1/575 |
| 2008/0174289 | A1 | 7/2008 | Gurcan et al. | |
| 2010/0253431 | A1* | 10/2010 | Fujiwara | G05F 1/575 |
| | | | | 330/253 |
| 2012/0038332 | A1* | 2/2012 | Lin | G05F 1/575 |
| | | | | 323/277 |
| 2012/0126760 | A1* | 5/2012 | Vemula | G05F 1/575 |
| | | | | 323/271 |
| 2014/0117958 | A1* | 5/2014 | Price | G05F 1/575 |
| | | | | 323/281 |
| 2014/0139197 | A1* | 5/2014 | Price | G05F 1/46 |
| | | | | 323/280 |

FOREIGN PATENT DOCUMENTS

| CN | 105005351 A | 10/2015 |
| CN | 104407662 A | 3/2016 |
| CN | 106774578 A | 5/2017 |

* cited by examiner

LOW DROPOUT LINEAR VOLTAGE REGULATOR

CROSS-REFERENCE TO RELATED APPLICATION

The present application is the National Stage Application, filed under 35 U.S.C. 371, of International Patent Application No. PCT/CN2017/106283 filed on Oct. 16, 2017, which claims priority to Chinese patent application No. 201710015426.8, filed on Jan. 10, 2017, contents of both of which are incorporated herein by reference in their entireties.

TECHNICAL FIELD

Embodiments of the present disclosure relate to an analog integrated circuit technology, for example, a low dropout linear voltage regulator.

BACKGROUND

Advanced electronic consumer devices such as mobile phones, laptops and music players being powered by batteries are portable. To make each electronic device more have versatile functions, an increasingly complex and highly integrated System-on-Chip (SoC) design is adopted. It is crucial for such SoC to use various power converters to achieve highly responsive, efficient and low-cost power management so as to obtain a competitive advantage. As a universal power converter, a low dropout linear voltage regulator has advantages such as low noise, low cost and fast response and is widely used in power management of the System-on-Chip.

In a negative feedback mechanism, a control loop of the low dropout linear voltage regulator can generate a desired output voltage by adjusting effective resistance of a power tube of the low dropout linear voltage regulator. In a typical low dropout linear voltage regulator, an off-chip capacitor in a range of a few µf is used to filter out noise and provide a dominant pole for stability of the low dropout linear voltage regulator at different load currents. However, as the number of low dropout linear voltage regulators keeps growing, it is important to remove off-chip capacitors to reduce costs and increase an integration level of development of the System-on-Chip.

For a fully integrated low dropout linear voltage regulator in the related art, how to achieve a wide bandwidth, fast response and good stability in a large load range remains to be solved.

SUMMARY

The present disclosure provides a low dropout linear voltage regulator to achieve a wide bandwidth and fast response without compromising loop stability or increasing consumption of a quiescent current.

A first aspect of the present disclosure provides a low dropout linear voltage regulator including: an error amplifier, a power transistor, a dynamic Miller compensation network and a controller.

A source of the power transistor is connected to a power source, a gate of the power transistor is connected to an output terminal of the error amplifier, and a drain of the power transistor is connected to an output terminal of the low dropout linear voltage regulator.

A first terminal of the dynamic Miller compensation network is connected to the output terminal of the error amplifier. A second terminal of the dynamic Miller compensation network is connected to the output terminal of the low dropout linear voltage regulator. A first terminal of the controller is connected to the gate of the power transistor, and a second terminal of the controller is connected to a third terminal of the Miller compensation network.

The dynamic Miller compensation network includes a first resistance-capacitance branch and at least one second resistance-capacitance branch, and the first resistance-capacitance branch is connected in parallel with the at least one second resistance-capacitance branch. The first resistance-capacitance branch includes a first resistor and a first capacitor connected in series, and each of the at least one second resistance-capacitance branch includes a second resistor and a second capacitor connected in series.

The controller is configured to detect a current at the output terminal of the low dropout linear voltage regulator and generate one or more control signals according to the current to control connection and disconnection of the each second resistance-capacitance branch in the dynamic Miller compensation network.

Optionally, the low dropout linear voltage regulator further includes a first feedback resistor and a second feedback resistor. A first terminal of the first feedback resistor and a first terminal of the second feedback resistor are connected to each other, and are connected to a positive input terminal of the error amplifier. A second terminal of the first feedback resistor is connected to the output terminal of the low dropout linear voltage regulator, and a second terminal of the second feedback resistor is grounded.

Optionally, the low dropout linear voltage regulator further includes at least one gain amplifier, where the at least one gain amplifier is in one-to-one correspondence with the at least one second resistance-capacitance branch.

The second resistor in the each of the at least one second resistance-capacitance branch is connected in parallel with a corresponding one of the at least one gain amplifier.

Optionally, the at least one gain amplifier has a gain of 1.

Optionally, the low dropout linear voltage regulator further includes a secondary amplifier. The secondary amplifier is connected in series with the error amplifier and the power transistor. A first terminal of the secondary amplifier is connected to the output terminal of the error amplifier, and a second terminal of the secondary amplifier is connected to the gate of the power transistor.

Optionally, the secondary amplifier is a voltage buffer.

Optionally, the low dropout linear voltage regulator further includes a zero generator including a third resistor and a zero generator switch. The third resistor is connected in series with the first resistor and the first capacitor separately after being connected in parallel with the zero generator switch, and a control signal for the zero generator switch and any control signal for the dynamic Miller compensation network are out-of-phase.

Optionally, the voltage buffer includes a first insulated gate transistor, a second insulated gate transistor, a third insulated gate transistor, a fourth insulated gate transistor, a fifth insulated gate transistor, a sixth insulated gate transistor and a seventh insulated gate transistor.

A gate of the seventh insulated gate transistor is connected to a gate of the sixth insulated gate transistor, a source of the seventh insulated gate transistor is connected to a source of the second insulated gate transistor, a source of the first insulated gate transistor and a drain of the sixth insulated gate transistor separately, a drain of the seventh insulated gate transistor is connected to an output terminal of the voltage buffer and a gate of the second insulated gate transistor separately, and a source of the sixth insulated gate transistor is connected to a source of the fifth insulated gate transistor and the power source separately.

A gate of the fifth insulated gate transistor is connected to a drain of the fifth insulated gate transistor and grounded.

A gate of the first insulated gate transistor is connected to the output terminal of the error amplifier, and a drain of the first insulated gate transistor is connected to a drain of the third insulated gate transistor and a gate of the third insulated gate transistor separately.

A drain of the second insulated gate transistor is connected to a drain of the fourth insulated gate transistor and the output terminal of the voltage buffer separately.

A source of the third insulated gate transistor is connected to a source of the fourth insulated gate transistor and grounded, and the gate of the third insulated gate transistor is connected to a gate of the fourth insulated gate transistor.

Optionally, the source of the sixth insulated gate transistor and the source of the second insulated gate transistor are configured to receive a first bias current generated by the controller, and a current value of the first bias current is in preset proportion to a current value of the current at the output terminal of the low dropout linear voltage regulator.

Optionally, the controller includes a first control transistor, a second control transistor, a third control transistor, a fourth control transistor, a fifth control transistor, a sixth control transistor, a seventh control transistor and an eighth control transistor.

A source of the first control transistor, a source of the seventh control transistor and a source of the eighth control transistor are connected to the power source. A gate of the first control transistor is connected to the gate of the power transistor, a source of the second control transistor is connected to the drain of the power transistor, a drain of the first control transistor is connected to a source of the third control transistor, a gate of the second control transistor is connected to a gate of the third control transistor, the gate of the second control transistor is connected to a drain of the second control transistor, the drain of the second control transistor is connected to a drain of the fourth control transistor, a drain of the third control transistor is connected to a drain of the fifth control transistor, a gate of the fourth control transistor, a gate of the fifth control transistor and a gate of the sixth control transistor are connected to each other, a source of the fourth control transistor, a source of the fifth control transistor and a source of the sixth control transistor are grounded, the gate of the fifth control transistor is connected to the drain of the fifth control transistor, a drain of the sixth control transistor is connected to a drain of the seventh control transistor, a gate of the seventh control transistor is connected to the drain of the seventh control transistor, the gate of the seventh control transistor is connected to a gate of the eighth control transistor, and a drain of the eighth control transistor is configured to output the first bias current.

Optionally, the controller further includes a plurality of control signal generating circuits and at least one third control signal transistor.

Each of the plurality of control signal generating circuits includes a first control signal transistor, a second control signal transistor, a first semiconductor element and a second semiconductor element.

A drain of the first control signal transistor and a source of the second control signal transistor are connected to the power source, and a gate of the first control signal transistor is connected to the gate of the sixth control transistor.

A drain of the second control signal transistor is connected to the drain of the first control signal transistor, the drain of the second control signal transistor is connected to an input terminal of the first semiconductor element, and a gate of the second control signal transistor is connected to an output terminal of the first semiconductor element.

The output terminal of the first semiconductor element is connected to an input terminal of the second semiconductor element, and an output terminal of the second semiconductor element is configured to output the one or more control signals.

Any two adjacent control signal generating circuits are a first control signal generating circuit and a second control signal generating circuit.

An output terminal of a second semiconductor element in the first control signal generating circuit is connected to a gate of a third control signal transistor, a source of the third control signal transistor is connected to the power source, and a drain of the third control signal transistor is connected to a drain of a second control signal transistor in the second control signal generating circuit.

Optionally, the controller further includes a fourth control signal transistor, a fifth control signal transistor, a third semiconductor element and a fourth semiconductor element.

A drain of the fourth control signal transistor and a source of the fifth control signal transistor are connected to the power source.

A gate of the fourth control signal transistor is connected to the gate of the sixth control transistor.

A drain of the fifth control signal transistor is connected to a drain of the fourth control signal transistor, the drain of the fifth control signal transistor is connected to an input terminal of the third semiconductor element, and a gate of the fifth control signal transistor is connected to an output terminal of the third semiconductor element.

The output terminal of the third semiconductor element is connected to an input terminal of the fourth semiconductor element, and an output terminal of the fourth semiconductor element is configured to output the one or more control signals.

According to the low dropout linear voltage regulator provided by the present disclosure, the controller is configured to detect the current at the output terminal of the low dropout linear voltage regulator and generate the control signal for the dynamic Miller compensation network according to the current, so as to control connection and disconnection of the each of the at least one second resistance-capacitance branch in the dynamic Miller compensation network. Further, the number of the second capacitors kept in the dynamic Miller compensation network is dynamically changed according to a load of the low dropout linear voltage regulator, so that the low dropout linear voltage regulator uses larger compensation capacitance to achieve good stability when the load current is low and uses smaller compensation capacitance to achieve rapid response and wide bandwidth when the load current is high.

DETAILED DESCRIPTION

Figure 1:
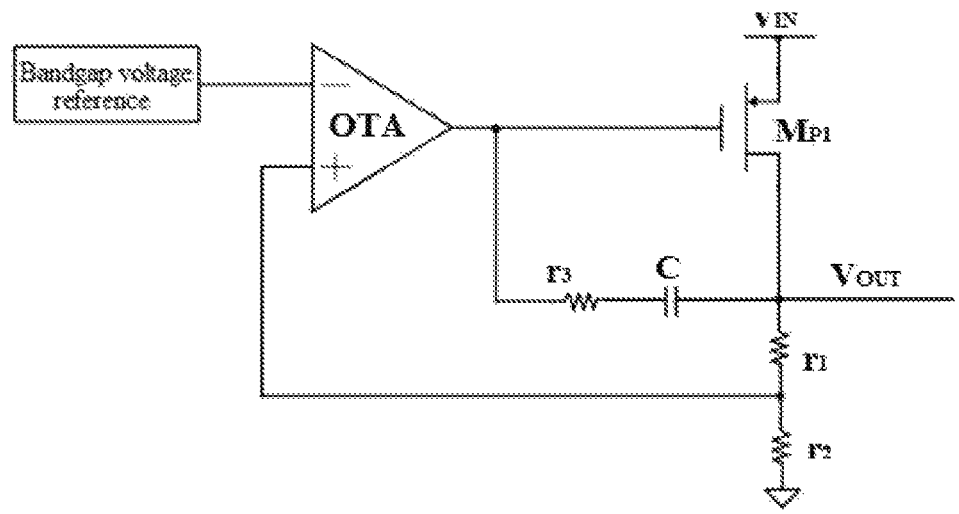
FIG. 1 is a circuit diagram of a low dropout linear voltage regulator without off-chip capacitors in the related art.
Figure 2:
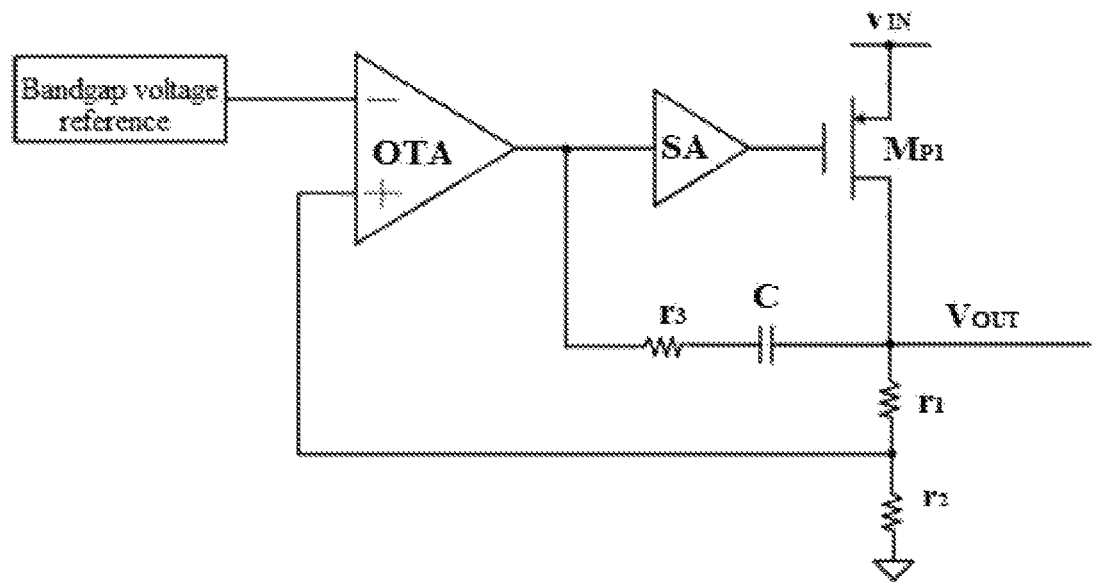
FIG. 2 is a circuit diagram of another low dropout linear voltage regulator without off-chip capacitors in the related art.

A low dropout linear voltage regulator without off-chip capacitors is provided in the related art. FIG. 1 is a circuit diagram of a low dropout linear voltage regulator without off-chip capacitors in the related art. FIG. 2 is a circuit diagram of another low dropout linear voltage regulator without off-chip capacitors in the related art. As shown in FIG. 1, the circuit includes an operational transconductance amplifier (OTA), a power transistor $M_{P1}$, a bandgap voltage reference, a resistor r1, a resistor r2, a resistor r3 and a capacitor C. The bandgap voltage reference provides a direct current (DC) reference voltage to an input terminal of the OTA. The resistor r1 and the resistor r2 are used to sample an output voltage ($V_{OUT}$) and feed it to another input terminal of the OTA to regulate the output voltage. The capacitor C and resistor r3 form a compensation network. The capacitor C is a Miller capacitor that helps the generation of a dominant pole. To achieve a large load current and a small dropout voltage, the power transistor $M_{P1}$ generally has a large width/length (W/L) ratio and thus has a large parasitic capacitance. As shown in FIG. 2, a secondary amplifier (SA) may be added between the OTA and the power transistor $M_N$. The secondary amplifier may have a gain to increase a total loop gain and thus increase regulation accuracy of the regulator. The secondary amplifier may be a voltage buffer to achieve faster regulation by increasing a drive capability of the OTA.

Embodiment I

Figure 3:
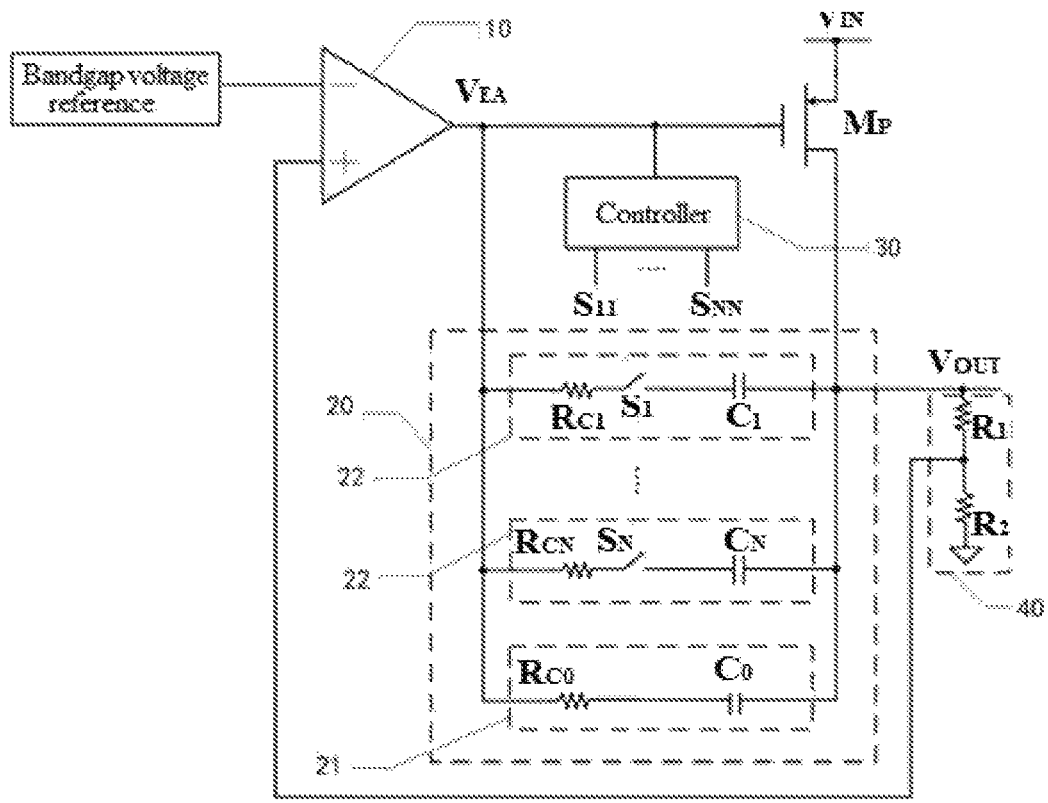
FIG. 3 is a circuit diagram of a low dropout linear voltage regulator according to Embodiment I.

FIG. 3 is a circuit diagram of a low dropout linear voltage regulator according to this embodiment. Referring to FIG. 3, the low dropout linear voltage regulator includes an error amplifier 10, a power transistor $M_P$, a dynamic Miller compensation network 20 and a controller 30. A source of the power transistor $M_P$ is connected to a power source $V_{IN}$, a gate of the power transistor $M_P$ is connected to an output terminal of the error amplifier 10, and a drain of the power transistor $M_P$ is connected to an output terminal $V_{OUT}$ of the low dropout linear voltage regulator. The dynamic Miller compensation network 20 is connected between the output terminal of the error amplifier 10 and the output terminal $V_{OUT}$ of the low dropout linear voltage regulator. A first terminal of the dynamic Miller compensation network 20 is connected to the output terminal of the error amplifier 10, a second terminal of the dynamic Miller compensation network 20 is connected to the output terminal $V_{OUT}$ of the low dropout linear voltage regulator. A first terminal of the controller 30 is connected to the gate of the power transistor $M_P$, and a second terminal of the controller 30 is connected to a third terminal of the Miller compensation network 20. The dynamic Miller compensation network 20 includes a first resistance-capacitance branch 21 and at least one second resistance-capacitance branch 22 connected in parallel with the first resistance-capacitance branch 21. The first resistance-capacitance branch 21 includes a first resistor $R_{C0}$ and a first capacitor $C_0$ connected in series, and each second resistance-capacitance branch 22 includes a second resistor (e.g., $R_{C1}$, . . . or $R_{CN}$) and a second capacitor (e.g., $C_1$, . . . or $C_N$) connected in series. The controller 30 is configured to detect a current at the output terminal $V_{OUT}$ of the low dropout linear voltage regulator and generate one or more control signals for the dynamic Miller compensation network 20 according to the current so as to control connection and disconnection of each second resistance-capacitance branch 22 in the dynamic Miller compensation network 20.

Optionally, the low dropout linear voltage regulator further includes a feedback resistor 40. The feedback resistor 40 includes a first feedback resistor $R_1$ and a second feedback resistor $R_2$. The first feedback resistor $R_1$ and the second feedback resistor $R_2$ are connected in series to form the feedback resistor 40. A first terminal of the first feedback resistor $R_1$ and a first terminal of the second feedback resistor $R_2$ are connected to each other, and are connected to a positive input terminal of the error amplifier 10. A second terminal of the first feedback resistor $R_1$ is connected to the output terminal $V_{OUT}$ of the low dropout linear voltage regulator. A second terminal of the second feedback resistor $R_2$ is grounded.

Optionally, in this embodiment, the error amplifier 10 is an operational transconductance amplifier (OTA). The OTA includes a positive input terminal, an inverting input terminal and an output terminal. A reference voltage is input to the inverting input terminal of the error amplifier 10. Optionally, the reference voltage is a bandgap reference voltage. The bandgap reference voltage is a reference voltage of the regulator. The dynamic Miller compensation network 20 includes a first resistance-capacitance branch 21 and at least one second resistance-capacitance branch 22. By way of example, the dynamic Miller compensation network 20 includes N second resistance-capacitance branches 22, where N is an integer not less than 1. In each second resistance-capacitance branch, the second resistor is denoted as one of $R_{C1}$, . . . and $R_{CN}$, and the second capacitor is denoted as one of $C_1$, . . . and $C_N$. Accordingly, the controller 30 generates the control signals for the dynamic Miller compensation network 20 according to the current at the output terminal $V_{OUT}$ of the low dropout linear voltage regulator. The number of the control signals is N. Each control signal is used for controlling a switch in a corresponding second resistance-capacitance branch 22 to be switched on or switched off. Switches controlled by the control signals are denoted as $S_1$, . . . and $S_N$ respectively. When the current (load current) at the output terminal of the low dropout linear voltage regulator changes, the controller 30 generates N control signals $S_{11}$, . . . and $S_{NN}$ for controlling the switches $S_1$, . . . and $S_N$ to be switched on or switched off respectively, so that the second capacitors $C_1$, . . . and $C_N$ in the second resistance-capacitance branches 22 are kept in the dynamic Miller compensation network 20 or removed from the dynamic Miller compensation network 20 to achieve a desired bandwidth with required phase and gain margin. By way of example, when the load current at the output terminal $V_{OUT}$ of the low dropout linear voltage regulator is small, the control signals $S_{11}$, . . . and $S_{NN}$ generated by the controller 30 control the switches $S_1$, . . . and $S_N$ to be switched on respectively, so that the second capacitors $C_1$, . . . and $C_N$ are kept in the dynamic Miller compensation network 20 and thus the low dropout linear voltage regulator achieves better stability. By way of example, when the load current at the output terminal $V_{OUT}$ of the low dropout linear voltage regulator is large, the control signals generated by the controller 30 control the switches $S_1$, . . . and $S_N$ to be switched off respectively, so that the second capacitors $C_1$, . . . and $C_N$ in the dynamic Miller compensation network 20 are disconnected and thus the low dropout linear voltage regulator achieves a better phase margin and a faster transient response.

Figure 4:
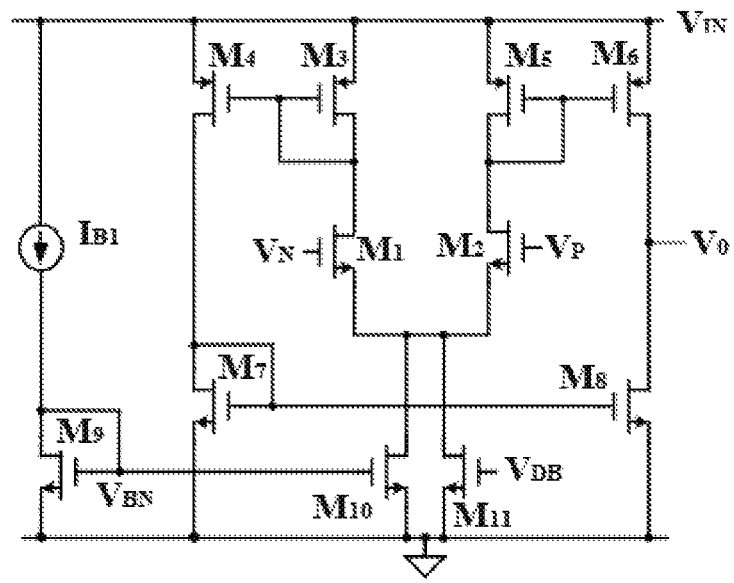
FIG. 4 is a circuit diagram of an operational transconductance amplifier in the low dropout linear voltage regulator according to Embodiment I.

In this embodiment, the operational transconductance amplifier (OTA) may be a current mirror amplifier. FIG. 4 is a circuit diagram of an operational transconductance amplifier in the low dropout linear voltage regulator according to this embodiment. As shown in FIG. 4, the OTA includes a pair of input terminals formed by first transistors $M_1$-$M_2$, three current mirrors formed by second transistors $M_3$-$M_4$, $M_5$-$M_6$ and $M_7$-$M_8$, a bias network formed by a bias current $I_{B1}$ and third transistors $M_9$-$M_{10}$, and a fourth transistor $M_{11}$. A gate of the fourth transistor $M_{11}$ may be applied with a voltage $V_{SB}$ separately. The fourth transistor $M_{11}$ may provide a dynamic bias current for the OAT. Sources of the second transistors $M_3$, $M_6$ are connected to the input power source $V_{IN}$. Sources of the second transistors $M_7$-$M_8$, sources of the third transistors $M_9$-$M_{10}$, and the source of the fourth transistor $M_{11}$ are connected to each other and grounded. Sources of the first transistors $M_1$-$M_2$, a drain of the third transistor $M_{10}$, and a drain of the fourth transistor $M_{11}$ are connected to each other. A drain of the first transistor $M_1$ is connected to a drain of the second transistor $M_3$. A drain of the first transistor $M_2$ is connected to a drain of the second transistor $M_5$. A drain of the second transistor $M_4$ is connected to a drain of the second transistor $M_7$. A drain of the second transistor $M_6$ and a drain of the second transistor $M_8$ are connected to an output terminal $V_O$ of the OTA. The bias current $I_{B1}$ is a current between the input power source $V_{IN}$ and the drain of the third transistor $M_9$. A response speed when the current at the output terminal of the low dropout linear voltage regulator is transient may be increased by instantaneously increasing or decreasing the bias current $I_{B1}$ in the OTA. The current mirror amplifier can provide a wide output voltage swing, facilitating to improve a wide load range of the low dropout linear voltage regulator.

Figure 5:
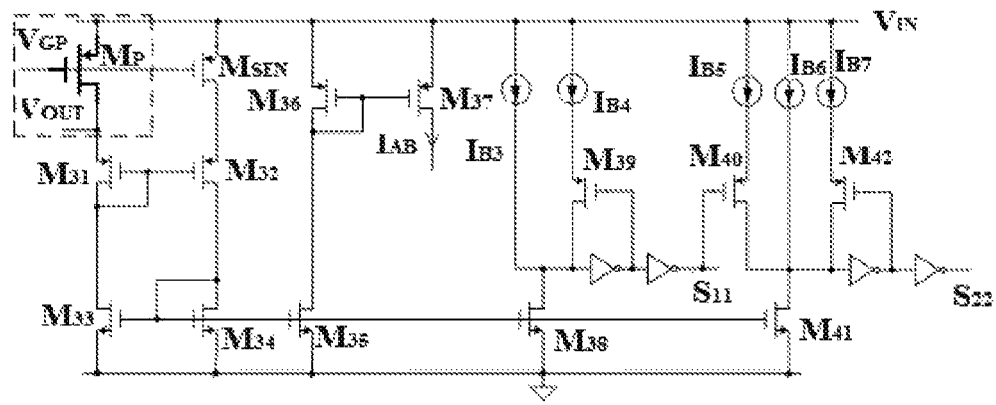
FIG. 5 is a circuit diagram of a controller in the low dropout linear voltage regulator according to Embodiment I.

FIG. 5 is a circuit diagram of a controller in the low dropout linear voltage regulator according to this embodiment. For ease of discussion, the power transistor $M_P$ is also shown in the circuit diagram of the controller. The controller includes a current detection module and a control signal generating module. The current detection module is composed of a fifth transistor $M_{SEN}$ and sixth transistors $M_{31}$-$M_{34}$. The sixth transistors $M_{31}$-$M_{34}$ form an amplifier, so that a drain voltage of the fifth transistor $M_{SEN}$ is the same as a drain voltage of the power transistor $M_P$ to achieve a precise current detection. To save power consumption of the current detection module, a detection ratio, that is, a ratio of a size of the fifth transistor $M_{SEN}$ to a size of the power transistor $M_P$ is set to 1:M. Usually M is an integer much greater than 1. For example, M is 100 or 1000. The detected load current is mirrored by seventh transistors $M_{35}$-$M_{37}$ to provide an adaptive bias current in $M_{37}$. The detected load current is also mirrored by eighth transistors $M_{38}$ and $M_{41}$ to facilitate to generate control signals for the dynamic Miller compensation network in the low dropout linear voltage regulator. By way of illustration, merely control signals $S_{11}$ and $S_{22}$ for the control switches $S_1$ and $S_2$ are shown. A first constant bias current $I_{B3}$ and a second constant bias current $I_{B7}$ have preset current values. Assume that the low dropout linear voltage regulator has a very small initial load current, both the control signals $S_{11}$ and $S_{22}$ are at a high level so that the second capacitors $C_1$ and $C_2$ are kept in the dynamic Miller compensation network to compensate for stability of the low dropout linear voltage regulator. In this case, ninth transistors $M_{39}$ and $M_{42}$ are turned on to allow currents $I_{B4}$ and $I_{B7}$ to pass, and a tenth transistor $M_{40}$ is turned off to block a current $I_{B5}$. When the load current exceeds a first preset value $I_{L1}$ so that the current of the eighth transistor $M_{38}$ is higher than the sum of currents $I_{B3}$ and $I_{B4}$, the voltage at a drain of the eighth transistor $M_{38}$ drops. Accordingly, the control signal $S_{11}$ is pulled down to a low level so that the second capacitor $C_1$ is removed from the dynamic Miller compensation network. Thus, the total number of the second capacitors in the dynamic Miller compensation network is reduced, and the bandwidth of the low dropout linear voltage regulator is improved. In this case, the control signal $S_{11}$ is at a low level, so the tenth transistor $M_{40}$ is turned on to allow the current $I_{B5}$ to pass. When a current of an eleventh transistor $M_{41}$ is higher than the sum of currents $I_{B5}$, $I_{B6}$ and $I_{B7}$ as the load current increases to be greater than a second preset value $I_{L2}$, the voltage at a drain of the eleventh transistor $M_{41}$ drops and the control signal $S_{22}$ is pulled down to a low level so that the second capacitor $C_2$ is removed from the dynamic Miller compensation network. Thus, the total number of the second capacitors in the dynamic Miller compensation network is reduced gradually so that the bandwidth of the low dropout linear voltage regulator is improved. More control signals may be generated in a similar way as needed. Due to the fact that the load current may vary, a tag is introduced through currents $I_{B4}$ and $I_{B7}$ to avoid oscillations in generation of control signals. By way of example, when the current of the eighth transistor $M_{38}$ is higher than the sum of $I_{B3}$ and $I_{B4}$ as the load current increases to be greater than $I_{L1}$, the control signal $S_{11}$ is switched from a high level to a low level. In this case, the ninth transistor $M_{39}$ is turned off and the current $I_{B4}$ is blocked. Only when the current of the eighth transistor $M_{38}$ is lower than the current $I_{B3}$ as the load current is greatly reduced, the voltage at the drain of the eighth transistor $M_{38}$ rises and the control signal $S_{11}$ is pulled up to a high level; otherwise, the control signal $S_{11}$ remains at a low level. In addition, small changes in the load current do not cause $S_{11}$ to be falsely triggered. Similarly, when the current of the eleventh transistor $M_{41}$ is higher than the sum of currents $I_{B5}$, $I_{B6}$ and $I_{B7}$ as the load current exceeds $I_{L2}$, the control signal $S_{22}$ is switched from a high level to a low level, and the current $I_{B7}$ is blocked by the ninth transistors $M_{42}$. Only when the current of the eleventh transistor $M_{41}$ is lower than the sum of $I_{B5}$ and $I_{B6}$ as the load current is greatly reduced, the control signal $S_{22}$ returns to a high level again.

According to the low dropout linear voltage regulator provided by this embodiment, a controller is adopted to detect the current at the output terminal of the low dropout linear voltage regulator and generate the control signal according to the current so as to control connection and disconnection of the each second resistance-capacitance branch in the dynamic Miller compensation network. The number of the second capacitors kept in the dynamic Miller compensation network is dynamically changed according to a load of the low dropout linear voltage regulator, so that the low dropout linear voltage regulator uses larger compensation capacitance to achieve good stability when the load current is low and uses smaller compensation capacitance to achieve rapid response and wide bandwidth when the load current is high.

Embodiment II

Figure 6:
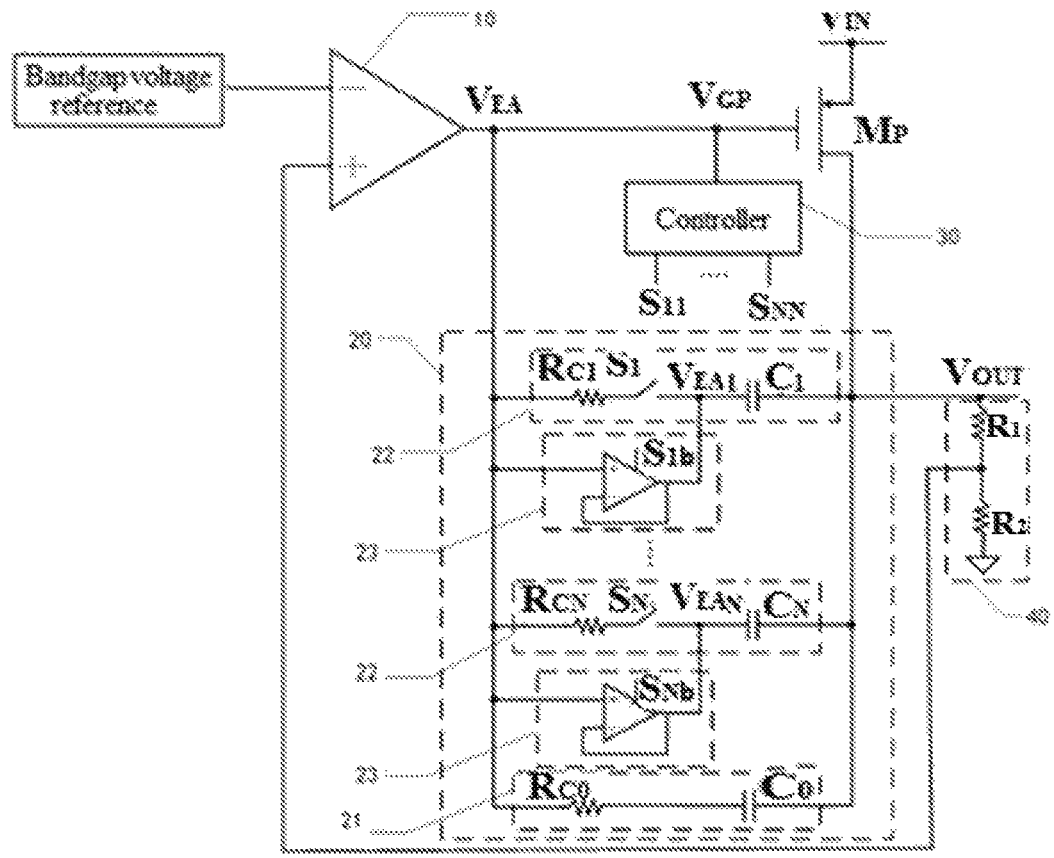
FIG. 6 is a circuit diagram of a low dropout linear voltage regulator according to Embodiment II.

FIG. 6 is a circuit diagram of a low dropout linear voltage regulator according to this embodiment. In this embodiment, at least one gain amplifier 23 is added on the basis of the above embodiment.

Optionally, the low dropout linear voltage regulator further includes at least one gain amplifier 23. The at least one gain amplifier 23 is in one-to-one correspondence with the at least one second resistance-capacitance branch 22 in the dynamic Miller compensation network 20. The second resistor ($R_{C1}$, ... and $R_{CN}$) in each second resistance-capacitance branch 22 is connected in parallel with a corresponding one of the at least one gain amplifier 23. Optionally, the at least one gain amplifier 23 has a gain of 1.

As shown in FIG. 6, the number of gain amplifiers 23 is N. For each gain amplifier 23, a switch ($S_{1b}$, ..., $S_{Nb}$) is controlled to be switched on or switched off by an inverting signal of the control signal ($S_{11}$, ..., $S_{NN}$) generated by the controller 30 so that the gain amplifier 23 is connected between the output terminal $V_{EA}$ of an error amplifier 20 and a terminal of a respective second capacitor ($C_1$, ..., $C_N$), that is, the gain amplifier 23 is connected between the output terminal $V_{EA}$ of an error amplifier 20 and one of $V_{EA1}$, ... and $V_{EAN}$. When any one of the second capacitors $C_1$, ... and $C_N$ is kept in the dynamic Miller compensation network 20, which usually occurs when the load current is small and a large compensation capacitance is required, the gain amplifier 23 corresponding to the second capacitor is turned off so that output of the gain amplifier 23 is in a high-impedance state, does not affect terminal $V_{EA1}$, ... and $V_{EAN}$ and saves power consumption when the load current is small. When any one of the second capacitors $C_1$, ... and $C_N$ is removed from the dynamic Miller compensation network 20, which usually occurs when the load current is large and small compensation capacitance is required, the gain amplifier 23 corresponding to the second capacitor is turned on so that the terminal $V_{EA1}$, ... and $V_{EAN}$ varies with the output terminal $V_{EA}$. Since no current flows through the second capacitors $C_1$, ... and $C_N$ in a steady state, voltages at the terminals $V_{EA1}$, ... and $V_{EAN}$ should be equal to the voltage at the output terminal $V_{EA}$. Thus, voltages at the terminals $V_{EA1}$, ... and $V_{EAN}$ in the steady state are always at required levels. When the load current is large and the second capacitors need to be kept in or removed from the dynamic Miller compensation network 20, the terminals $V_{EA1}$, ... and $V_{EAN}$ do not cause a large voltage peak at the output terminal $V_{EA}$ through the switches $S_1$, ... and $S_N$ and the second resistors $R_{C1}$, ... and $R_{CN}$, making a transient response smoother. Since the load current is large when the second capacitors $C_1$, ... and $C_N$ are disconnected from the dynamic Miller compensation network 20, extra current consumed by the corresponding gain amplifiers 23 being turned on does not impair a current efficiency of the regulator.

The low dropout linear voltage regulator provided by this embodiment can increase a transient response speed of the low dropout linear voltage regulator by adding at least one gain amplifier.

Embodiment III

Figure 7:
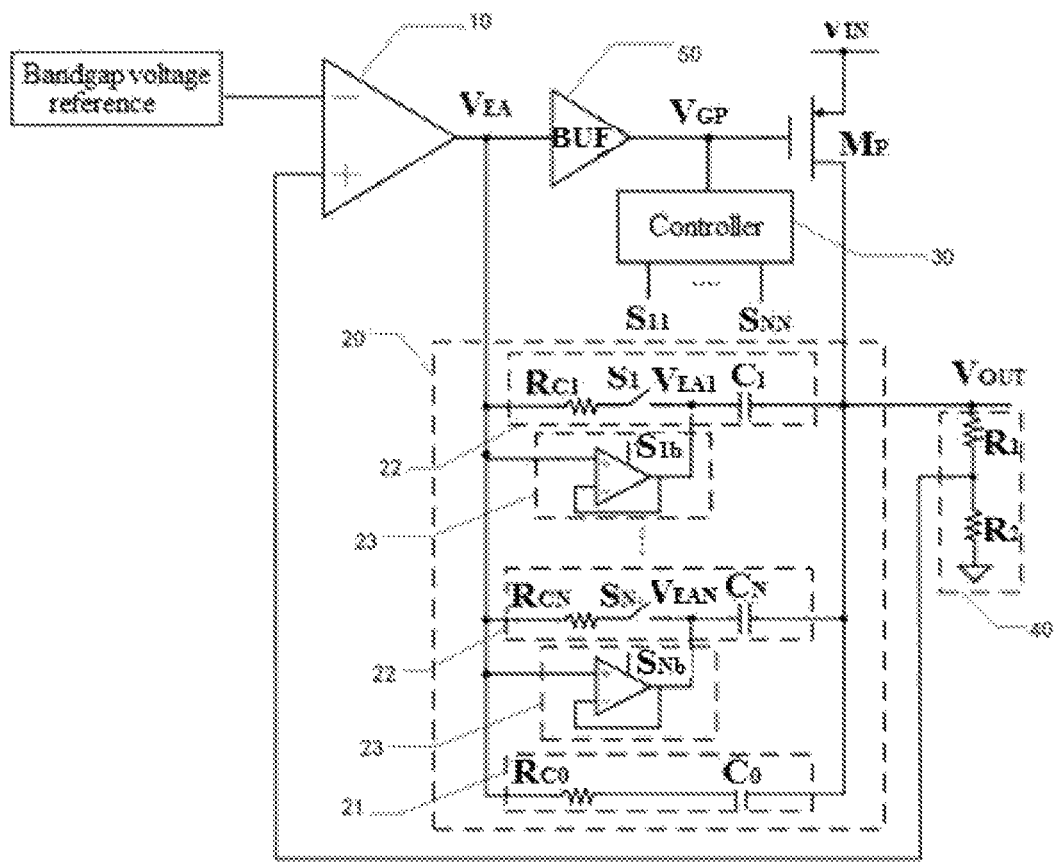
FIG. 7 is a circuit diagram of a low dropout linear voltage regulator according to Embodiment III.

FIG. 7 is a circuit diagram of a low dropout linear voltage regulator according to this embodiment. In this embodiment, a secondary amplifier 50 is added on the basis of the above embodiments.

Optionally, the low dropout linear voltage regulator further includes a secondary amplifier 50. The secondary amplifier 50 is connected in series between the output terminal of the error amplifier 10 and the gate of the power transistor $M_P$. That is, the secondary amplifier 50 is connected in series with the error amplifier 10 and the secondary amplifier 50 is connected in series with the power transistor $M_P$. A first terminal of the secondary amplifier 50 is connected to the output terminal of the error amplifier 10, and a second terminal of the secondary amplifier 50 is connected to the gate of the power transistor $M_P$. Optionally, the secondary amplifier 50 is a voltage buffer (BUF).

Figure 8A:
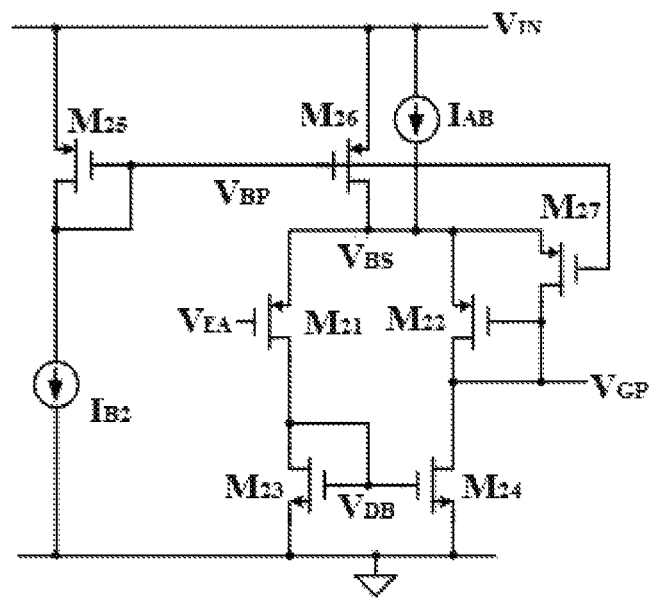
FIG. 8A is a circuit diagram of a voltage buffer in the low dropout linear voltage regulator according to Embodiment III.
Figure 8B:
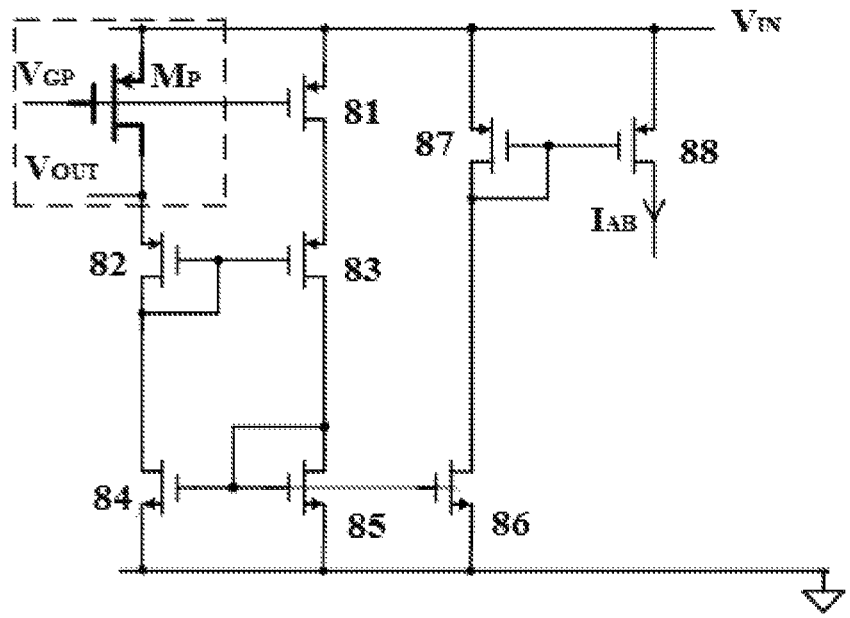
FIG. 8B is a circuit diagram of a controller according to Embodiment III.

FIG. 8A is a circuit diagram of a voltage buffer in the low dropout linear voltage regulator according to this embodiment. As shown in FIG. 8A, the voltage buffer includes a first insulated gate transistor $M_{21}$, a second insulated gate transistor $M_{22}$, a third insulated gate transistor $M_{23}$, a fourth insulated gate transistor $M_{24}$, a fifth insulated gate transistor $M_{25}$, a sixth insulated gate transistor $M_{26}$ and a seventh insulated gate transistor $M_{27}$. A gate of the seventh insulated gate transistor $M_{27}$ is connected to a gate of the sixth insulated gate transistor $M_{26}$. A source of the seventh insulated gate transistor $M_{27}$ is connected to a source of the second insulated gate transistor $M_{22}$, a source of the first insulated gate transistor $M_{21}$ and a drain of the sixth insulated gate transistor $M_{26}$ separately. A drain of the seventh insulated gate transistor $M_{27}$ is connected to an output terminal of the voltage buffer and a gate of the second insulated gate transistor $M_{22}$ separately. A source of the sixth insulated gate transistor $M_{26}$ is connected to a source of the fifth insulated gate transistor $M_{25}$ and the power source separately. A gate of the fifth insulated gate transistor $M_{25}$ is connected to a drain of thereof and grounded. A gate of the first insulated gate transistor $M_{21}$ is connected to the output terminal of the error amplifier, and a drain of the first insulated gate transistor $M_{21}$ is connected to a drain of the third insulated gate transistor $M_{23}$ and a gate of the third insulated gate transistor $M_{23}$ separately. A drain of the second insulated gate transistor $M_{22}$ is connected to a drain of the fourth insulated gate transistor $M_{24}$ and the output terminal of the voltage buffer separately. A source of the third insulated gate transistor $M_{23}$ and a source of the fourth insulated gate transistor $M_{24}$ are connected to each other and grounded, and the gate of the third insulated gate transistor $M_{23}$ is connected to a gate of the fourth insulated gate transistor $M_{24}$. Optionally, a first bias current $I_{AB}$ having a preset current value is supplied between the source of the sixth insulated gate transistor $M_{26}$ and the source of the second insulated gate transistor $M_{22}$. By way of example, the value of the first bias current $I_{AB}$ varies with the value of the current at the output terminal of the low dropout linear voltage regulator according to a preset proportion, and the value of the first bias current $I_{AB}$ is in preset proportion to the value of the current at the output terminal of the low dropout linear voltage regulator. The first bias current $I_{AB}$ may be provided by the seventh transistor $M_{37}$ of FIG. 5.

In this embodiment, the first insulated gate transistor $M_{21}$ and the second insulated gate transistor $M_{22}$ form the input terminal of the voltage buffer; the third insulated gate transistor $M_{23}$ and the fourth insulated gate transistor $M_{24}$ form an active load of the voltage buffer; and the fifth insulated gate transistor $M_{25}$, the sixth insulated gate transistor $M_{26}$, and a second bias current $I_{B2}$ between the drain of the fifth insulated gate transistor $M_{25}$ and the ground form a bias network. When the current at the output terminal of the low dropout linear voltage regulator is small, the voltage $V_{EA}$ at the output terminal of the error amplifier 10 approaches the supply voltage and a voltage $V_{B5}$ in the voltage buffer is at a high level. In this case, the seventh insulated gate transistor $M_{27}$ is turned on, and the current of the sixth insulated gate transistor $M_{26}$ can pass the seventh insulated gate transistor $M_{27}$ to apply a voltage $V_{GP}$ to the output terminal of the voltage buffer so that the power transistor $M_P$ works in a weak-inversion or subthreshold region. When the current at the output terminal of the low dropout linear voltage regulator is large, the voltage $V_{EA}$ at the output terminal of the error amplifier 10 is small and the voltage $V_{B5}$ in the voltage buffer is also small. In this case, the seventh insulated gate transistor $M_{27}$ is turned off, and since the first insulated gate transistor $M_{21}$ and the second insulated gate transistor $M_{22}$ form the input terminal of the voltage buffer, a lower limit of an output swing of the voltage buffer is small so that the power transistor $M_P$ in the low dropout linear voltage regulator can be better turned on and thus the low dropout linear voltage regulator can have a larger load current capability. It is to be noted that the voltage buffer is applicable not only to the low dropout linear voltage regulator provided in this embodiment, but also to a general low dropout linear voltage regulator that includes off-chip capacitors or does not include off-chip capacitors.

Optionally, on the basis of the above embodiments, referring to FIG. 8, the controller includes a first control transistor 81, a second control transistor 82, a third control transistor 83, a fourth control transistor 84, a fifth control transistor 85, a sixth control transistor 86, a seventh control transistor 87 and an eighth control transistor 88.

A source of the first control transistor 81, a source of the seventh control transistor 87 and a source of the eighth control transistor 88 are connected to the power source $V_{IN}$. A gate of the first control transistor 81 is connected to the gate of the power transistor $M_P$. A source of the second control transistor 82 is connected to the drain of the power transistor $M_P$. A drain of the first control transistor 81 is connected to a source of the third control transistor 83. A gate of the second control transistor 82 is connected to a gate of the third control transistor 83 and a drain of the second control transistor 82. The drain of the second control transistor 82 is connected to a drain of the fourth control transistor 84. A drain of the third control transistor 83 is connected to a drain of the fifth control transistor 85. A gate of the fourth control transistor 84, a gate of the fifth control transistor 85 and a gate of the sixth control transistor 86 are connected to each other. A source of the fourth control transistor 84, a source of the fifth control transistor 85 and a source of the sixth control transistor 86 are grounded. The gate of the fifth control transistor 85 is connected to the drain of the fifth control transistor 85. A drain of the sixth control transistor 86 is connected to a drain of the seventh control transistor 87. A gate of the seventh control transistor 87 is connected to the drain of the seventh control transistor 87 and a gate of the eighth control transistor 88. A drain of the eighth control transistor 88 is configured to output the first bias current $I_{AB}$.

The value of the first bias current $I_{AB}$ is in preset proportion to the value of the current at the output terminal of the low dropout linear voltage regulator.

Figure 8C:
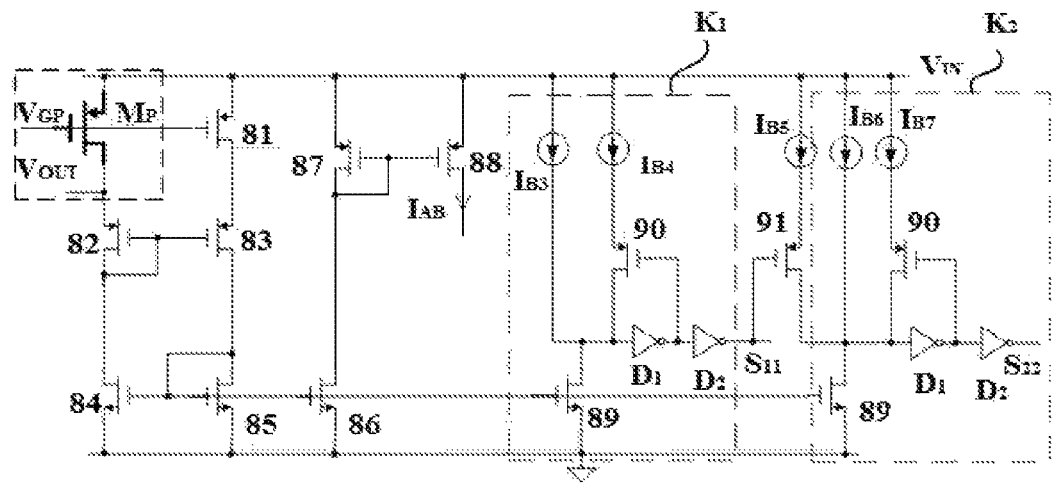
FIG. 8C is a circuit diagram of another controller according to Embodiment III.

Optionally, on the basis of the above embodiment, in the case that the controller outputs a plurality of control signals, referring to FIG. 8C, the controller further includes a plurality of control signal generating circuits and at least one third control signal transistor 91. Each of the plurality of control signal generating circuits includes a first control signal transistor 89, a second control signal transistor 90, a first semiconductor element $D_1$ and a second semiconductor element $D_2$. A drain of the first control signal transistor 89 and a source of the second control signal transistor 90 are connected to the power source $V_{IN}$. A gate of the first control signal transistor 89 is connected to the gate of the sixth control transistor 86. A drain of the second control signal transistor 90 is connected to the drain of the first control signal transistor 89 and an input terminal of the first semiconductor element $D_1$. A gate of the second control signal transistor 90 is connected to an output terminal of the first semiconductor element $D_1$. The output terminal of the first semiconductor element $D_1$ is connected to an input terminal of the second semiconductor element $D_2$, and an output terminal of the second semiconductor element $D_2$ is configured to output the control signal (two control signals $S_{11}$ and $S_{22}$ are shown in the figure by way of example). Any two adjacent control signal generating circuits are a first control signal generating circuit K1 and a second control signal generating circuit K2. An output terminal of a second semiconductor element $D_2$ in the first control signal generating circuit K1 is connected to a gate of the third control signal transistor 91. A source of the third control signal transistor 91 is connected to the power source $V_{IN}$, and a drain of the third control signal transistor 91 is connected to a drain of the second control signal transistor 90 in the second control signal generating circuit K2. $I_{B3}$ to $I_{B7}$ are current values. Transistor parameters of the first control signal transistor 89 in the first control signal generating circuit K1 may be different from transistor parameters of the first control signal transistor 89 in the second control signal generating circuit K2. Transistor parameters of the second control signal transistor 90 in the first control signal generating circuit K1 may also be different from transistor parameters of the second control signal transistor 90 in the second control signal generating circuit K2.

Figure 8D:
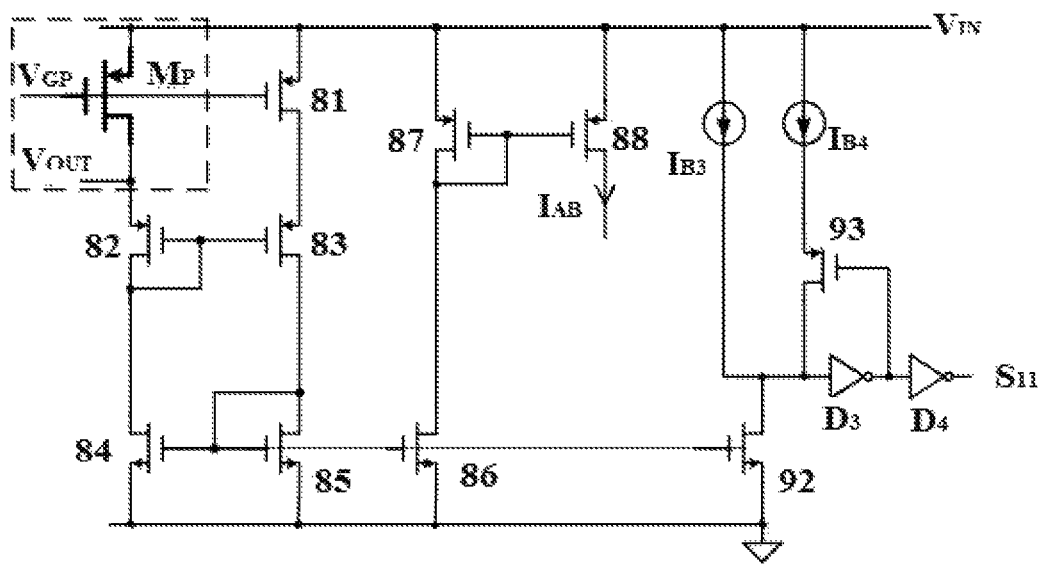
FIG. 8D a circuit diagram of another controller according to Embodiment III.

Optionally, on the basis of the above embodiment, in the case that the controller outputs only one control signal, referring to FIG. 8D, the controller further includes a fourth control signal transistor 92, a fifth control signal transistor 93, a third semiconductor element $D_3$ and a fourth semiconductor element $D_4$. A drain of the fourth control signal transistor 92 and a source of the fifth control signal transistor 93 are connected to the power source $V_{IN}$. A gate of the fourth control signal transistor 92 is connected to the gate of the sixth control transistor 86. A drain of the fifth control signal transistor 93 is connected to a drain of the fourth control signal transistor 92 and an input terminal of the third semiconductor element $D_3$. A gate of the fifth control signal transistor 93 is connected to an output terminal of the third semiconductor element $D_3$. The output terminal of the third semiconductor element $D_3$ is connected to an input terminal of the fourth semiconductor element $D_4$, and an output terminal of the fourth semiconductor element $D_4$ is configured to output the control signal $S_{11}$.

By use of the low-power wide-swing voltage buffer, the low dropout linear voltage regulator provided by this embodiment ensures regulation accuracy of the low dropout linear voltage regulator and increases a response speed of the low dropout linear voltage regulator, so that the low dropout linear voltage regulator is better applicable to power management of a System-on-Chip.

Embodiment IV

Figure 9:
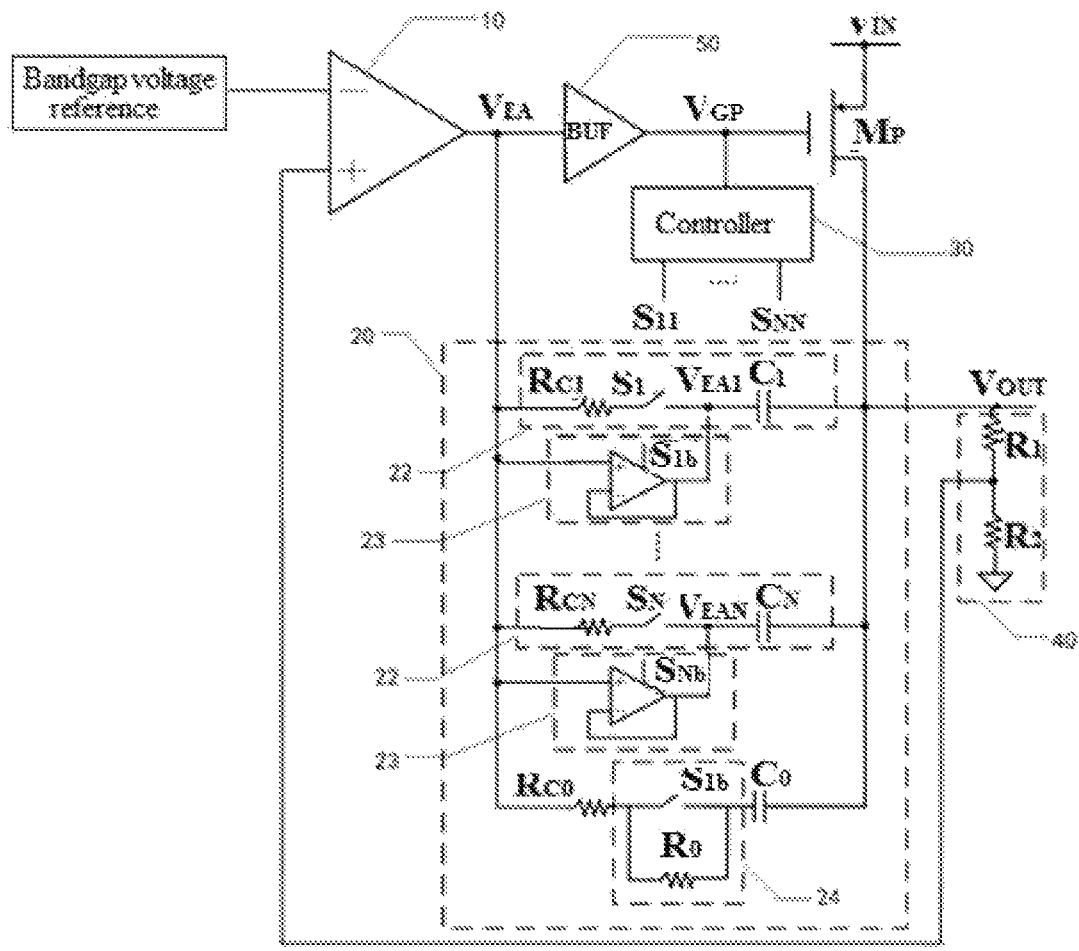
FIG. 9 is a circuit diagram of a low dropout linear voltage regulator according to Embodiment IV.

FIG. 9 is a circuit diagram of a low dropout linear voltage regulator according to this embodiment. In this embodiment, a zero generator 24 is added on the basis of the above embodiment.

Optionally, the low dropout linear voltage regulator further includes a zero generator 24 including a third resistor $R_0$ and a zero generator switch $S_{1b}$. The third resistor $R_0$ and the zero generator switch $S_{1b}$ are connected in parallel with each other, and each of the third resistor $R_0$ and the zero generator switch $S_{1b}$ is connected in series with the first resistor $R_{C0}$ and the first capacitor $C_0$. A control signal for the zero generator switch $S_{1b}$ and any control signal in the dynamic Miller compensation network are out-of-phase.

By way of example, the control signal for the zero generator switch $S_{1b}$ and from the control signal for the control switch $S_1$ in the dynamic Miller compensation network are out-of-phase, that is, the switch $S_1$ is switched on when the zero generator switch $S_{1b}$ is switched off, and the switch $S_1$ is switched off when the zero generator switch $S_{1b}$ is switched on. After connected in parallel with each other, the third resistor $R_0$ and the zero generator switch $S_{1b}$ are connected in series between the first resistor $R_{C0}$ and the first capacitor $C_0$. A resistance value of the third resistor $R_0$ is much greater than a resistance value of the first resistor $R_{C0}$. The zero generator switch $S_{1b}$ and the third resistor $R_0$ form the zero generator 24. The zero generator 24 is a left half plane (LHP) zero generator so that the low dropout linear voltage regulator has a better phase margin when the low dropout linear voltage regulator bears a small load or bears no load. When the current at the output terminal of the low dropout linear voltage regulator is less than a threshold, the switches $S_1, \ldots$ and $S_N$ are switched on, the first $S_{1b}$ is switched off, and the third resistor $R_0$ is connected to the dynamic Miller compensation network. The resistance value of the third resistor $R_0$ is much greater than the resistance value of the first resistor $R_{C0}$, so a right half plane (RHP) zero in the dynamic Miller compensation network can be reduced or eliminated or even one LHP zero is generated. In this way, the low dropout linear voltage regulator has a better phase margin. When the current at the output terminal of a low dropout linear voltage regulator increases, it is not needed to have a large resistance value in the dynamic Miller compensation network to obtain a suitable phase margin. Moreover, if the resistance value is too large, the dynamic Miller compensation network will be disconnected. This will damage the effect of dynamic Miller frequency compensation and the pole splitting effect will disappear. Therefore, when the current at the output terminal of the low dropout linear voltage regulator increases to a preset value, the zero generator switch $S_{1b}$ is switched on and the first resistor $R_0$ is disconnected from the dynamic Miller compensation network.

In the low dropout linear voltage regulator provided by this embodiment, the zero generator is added to allow the resistor in the dynamic Miller compensation network to have a larger resistance value when the regulator bears a lighter load or bears no load, and allow the regulator to have a smaller resistance value when the regulator bears a heavier load, so that the regulator has a better phase margin. This helps eliminate the right half plane zero brought by dynamic Miller compensation and create an appropriate left half plane zero without damaging Miller frequency compensation and pole splitting effect.

INDUSTRIAL APPLICABILITY

According to the low dropout linear voltage regulator provided by the present disclosure, the controller is configured to detect the current at the output terminal of the low dropout linear voltage regulator and generate the control signal for the dynamic Miller compensation network according to the current, so as to control connection and disconnection of the each of the at least one second resistance-capacitance branch in the dynamic Miller compensation network. Further, the number of the second capacitors kept in the dynamic Miller compensation network is dynamically changed according to a load of the low dropout linear voltage regulator, so that the low dropout linear voltage regulator uses larger compensation capacitance to achieve good stability when the load current is low and uses smaller compensation capacitance to achieve rapid response and wide bandwidth when the load current is high.

What is claimed is:

1. A low dropout linear voltage regulator, comprising: an error amplifier, a power transistor, a dynamic Miller compensation network and a controller,
    wherein a source of the power transistor is connected to a power source, a gate of the power transistor is connected to an output terminal of the error amplifier, and a drain of the power transistor is connected to an output terminal of the low dropout linear voltage regulator;
    a first terminal of the dynamic Miller compensation network is connected to the output terminal of the error amplifier, a second terminal of the dynamic Miller compensation network is connected to the output terminal of the low dropout linear voltage regulator; a first terminal of the controller is connected to the gate of the power transistor, and a second terminal of the controller is connected to a third terminal of the dynamic Miller compensation network;
    the dynamic Miller compensation network comprises a first resistance-capacitance branch and at least one second resistance-capacitance branch, and the first resistance-capacitance branch is connected in parallel with the at least one second resistance-capacitance branch, wherein the first resistance-capacitance branch comprises a first resistor and a first capacitor connected in series, and each of the at least one second resistance-capacitance branch comprises a second resistor and a second capacitor connected in series; and
    the controller is configured to detect a current at the output terminal of the low dropout linear voltage regulator and generate one or more control signals according to the current to control connection and disconnection of each of the at least one second resistance-capacitance branch in the dynamic Miller compensation network.

2. The low dropout linear voltage regulator according to claim 1, further comprising: a first feedback resistor and a second feedback resistor, wherein a first terminal of the first feedback resistor and a first terminal of the second feedback resistor are connected to each other and are connected to a positive input terminal of the error amplifier, a second terminal of the first feedback resistor is connected to the output terminal of the low dropout linear voltage regulator, and a second terminal of the second feedback resistor is grounded.

3. The low dropout linear voltage regulator according to claim 2, further comprising a zero generator having a third resistor and a zero generator switch, wherein the third resistor is connected in series with the first resistor and the first capacitor separately after being connected in parallel with the zero generator switch, and a control signal for the zero generator switch and any control signal for the dynamic Miller compensation network are out-of-phase.

4. The low dropout linear voltage regulator according to claim 2, further comprising: at least one gain amplifier, wherein the at least one gain amplifier is in one-to-one correspondence with the at least one second resistance-capacitance branch,
wherein the second resistor in each of the at least one second resistance-capacitance branch is connected in parallel with a corresponding one of the at least one gain amplifier.

5. The low dropout linear voltage regulator according to claim 4, further comprising a zero generator having a third resistor and a zero generator switch, wherein the third resistor is connected in series with the first resistor and the first capacitor separately after being connected in parallel with the zero generator switch, and a control signal for the zero generator switch and any control signal for the dynamic Miller compensation network are out-of-phase.

6. The low dropout linear voltage regulator according to claim 4, wherein the at least one gain amplifier has a gain of 1.

7. The low dropout linear voltage regulator according to claim 6, further comprising a zero generator having a third resistor and a zero generator switch, wherein the third resistor is connected in series with the first resistor and the first capacitor separately after being connected in parallel with the zero generator switch, and a control signal for the zero generator switch and any control signal for the dynamic Miller compensation network are out-of-phase.

8. The low dropout linear voltage regulator according to claim 4, further comprising: a secondary amplifier, wherein the secondary amplifier is connected in series with the error amplifier and the power transistor, wherein a first terminal of the secondary amplifier is connected to the output terminal of the error amplifier, and a second terminal of the secondary amplifier is connected to the gate of the power transistor.

9. The low dropout linear voltage regulator according to claim 8, further comprising a zero generator having a third resistor and a zero generator switch, wherein the third resistor is connected in series with the first resistor and the first capacitor separately after being connected in parallel with the zero generator switch, and a control signal for the zero generator switch and any control signal for the dynamic Miller compensation network are out-of-phase.

10. The low dropout linear voltage regulator according to claim 8, wherein the secondary amplifier is a voltage buffer.

11. The low dropout linear voltage regulator according to claim 10, further comprising a zero generator having a third resistor and a zero generator switch, wherein the third resistor is connected in series with the first resistor and the first capacitor separately after being connected in parallel with the zero generator switch, and a control signal for the zero generator switch and any control signal for the dynamic Miller compensation network are out-of-phase.

12. The low dropout linear voltage regulator according to claim 10, wherein the voltage buffer comprises a first insulated gate transistor, a second insulated gate transistor, a third insulated gate transistor, a fourth insulated gate transistor, a fifth insulated gate transistor, a sixth insulated gate transistor and a seventh insulated gate transistor,
wherein a gate of the seventh insulated gate transistor is connected to a gate of the sixth insulated gate transistor, a source of the seventh insulated gate transistor is connected to a source of the second insulated gate transistor, a source of the first insulated gate transistor and a drain of the sixth insulated gate transistor separately, a drain of the seventh insulated gate transistor is connected to an output terminal of the voltage buffer and a gate of the second insulated gate transistor separately; and a source of the sixth insulated gate transistor is connected to a source of the fifth insulated gate transistor and the power source separately;
a gate of the fifth insulated gate transistor is connected to a drain of the fifth insulated gate transistor and grounded;
a gate of the first insulated gate transistor is connected to the output terminal of the error amplifier, and a drain of the first insulated gate transistor is connected to a drain of the third insulated gate transistor and a gate of the third insulated gate transistor separately;
a drain of the second insulated gate transistor is connected to a drain of the fourth insulated gate transistor and the output terminal of the voltage buffer separately; and
a source of the third insulated gate transistor is connected to a source of the fourth insulated gate transistor and grounded, and the gate of the third insulated gate transistor is connected to a gate of the fourth insulated gate transistor.

13. The low dropout linear voltage regulator according to claim 12, wherein the source of the sixth insulated gate transistor and the source of the second insulated gate transistor are configured to receive a first bias current generated by the controller, and a value of the first bias current is in preset proportion to a value of the current at the output terminal of the low dropout linear voltage regulator.

14. The low dropout linear voltage regulator according to claim 13, wherein the controller comprises a first control transistor, a second control transistor, a third control transistor, a fourth control transistor, a fifth control transistor, a sixth control transistor, a seventh control transistor and an eighth control transistor,
wherein a source of the first control transistor, a source of the seventh control transistor and a source of the eighth control transistor are connected to the power source, a gate of the first control transistor is connected to the gate of the power transistor, a source of the second control transistor is connected to the drain of the power transistor, a drain of the first control transistor is connected to a source of the third control transistor, a gate of the second control transistor is connected to a gate of the third control transistor and a drain of the second control transistor, the drain of the second control transistor is connected to a drain of the fourth control transistor, a drain of the third control transistor is connected to a drain of the fifth control transistor, a gate of the fourth control transistor, a gate of the fifth control transistor and a gate of the sixth control transistor are connected to each other, a source of the fourth control transistor, a source of the fifth control transistor and a source of the sixth control transistor are grounded, the gate of the fifth control transistor is connected to the drain of the fifth control transistor, a drain of the sixth control transistor is connected to a drain of the seventh control transistor, a gate of the seventh control transistor is connected to the drain of the seventh control transistor, the gate of the seventh control transistor is connected to a gate of the eighth control transistor, and a drain of the eighth control transistor is configured to output the first bias current.

15. The low dropout linear voltage regulator according to claim 14, wherein the controller further comprises: a plurality of control signal generating circuits and at least one third control signal transistor, wherein each of the plurality of control signal generating circuits comprises: a first control signal transistor, a second control signal transistor, a first semiconductor element and a second semiconductor element;

a drain of the first control signal transistor and a source of the second control signal transistor are connected to the power source, and a gate of the first control signal transistor is connected to the gate of the sixth control transistor, a drain of the second control signal transistor is connected to the drain of the first control signal transistor and an input terminal of the first semiconductor element, and a gate of the second control signal transistor is connected to an output terminal of the first semiconductor element;

the output terminal of the first semiconductor element is connected to an input terminal of the second semiconductor element, and an output terminal of the second semiconductor element is configured to output the control signal;

any two adjacent control signal generating circuits are a first control signal generating circuit and a second control signal generating circuit; and the output terminal of the second semiconductor element in the first control signal generating circuit is connected to a gate of the at least one third control signal transistor, a source of the at least one third control signal transistor is connected to the power source, and a drain of the at least one third control signal transistor is connected to the drain of a second control signal transistor in the second control signal generating circuit.

16. The low dropout linear voltage regulator according to claim 14, wherein the controller further comprises a fourth control signal transistor, a fifth control signal transistor, a third semiconductor element and a fourth semiconductor element, wherein a drain of the fourth control signal transistor and a source of the fifth control signal transistor are connected to the power source, a gate of the fourth control signal transistor is connected to the gate of the sixth control transistor, a drain of the fifth control signal transistor is connected to a drain of the fourth control signal transistor and an input terminal of the third semiconductor element, and a gate of the fifth control signal transistor is connected to an output terminal of the third semiconductor element, and the output terminal of the third semiconductor element is connected to an input terminal of the fourth semiconductor element, and an output terminal of the fourth semiconductor element is configured to output the control signal.

* * * * *